United States Patent [19]

Kumagai et al.

[11] Patent Number: 4,950,617
[45] Date of Patent: Aug. 21, 1990

[54] METHOD OF MANUFACTURING SEMICONDUCTOR DEVICE

[75] Inventors: Jumpei Kumagai; Satoshi Shinozaki, both of Yokohama, Japan

[73] Assignee: Kabushiki Kaisha Toshiba, Kawasaki, Japan

[21] Appl. No.: 296,307

[22] Filed: Jan. 12, 1989

Related U.S. Application Data

[63] Continuation of Ser. No. 117,523, Nov. 6, 1987, abandoned.

[30] Foreign Application Priority Data

Nov. 7, 1986 [JP] Japan .................................. 61-265022

[51] Int. Cl.⁵ .......................................... H01L 21/336
[52] U.S. Cl. .......................................... 437/41; 437/29; 437/40; 437/44; 437/47; 437/52; 437/229
[58] Field of Search .................... 437/27, 34, 40, 41, 437/51, 56, 57, 200, 228, 44, 45, 46, 29, 229; 351/42, 47

[56] References Cited

U.S. PATENT DOCUMENTS

| | | | |
|---|---|---|---|
| 4,070,687 | 1/1980 | Ho et al. ................................ | 437/27 |
| 4,235,011 | 11/1980 | Butler et al. .......................... | 437/27 |
| 4,294,002 | 10/1981 | Jambotkar et al. ................... | 437/44 |
| 4,354,307 | 10/1982 | Vinson et al. ......................... | 437/27 |
| 4,375,717 | 3/1983 | Tunnel .................................. | 437/27 |

Primary Examiner—Brian E. Hearn
Assistant Examiner—T. Thomas
Attorney, Agent, or Firm—Finnegan, Henderson, Farabow, Garrett and Dunner

[57] ABSTRACT

This invention discloses a semiconductor integrated circuit in which an input protecting circuit and an inner circuit are formed on a single semiconductor substrate and a MOS transistor of the inner circuit is formed by mask-alignment. The source and drain regions of the MOS transistor of the input protecting circuit are formed by self-alignment, so that the impurity concentration of the source and drain regions is increased and the diffusion resistance thereof is reduced, thereby increasing the junction breakdown power caused by a drain current. In addition, the radii of curvature of the junction curved surface portions of the source and drain regions of the MOS transistor of the input protecting circuit are increased so as to reduce the electric field intensity at the junction curved surface portions, thereby improving the junction breakdown withstand characteristics.

15 Claims, 11 Drawing Sheets

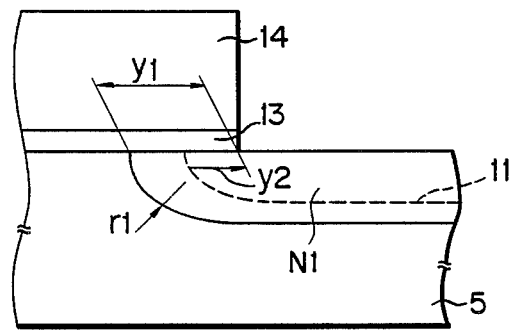
F I G. 8A
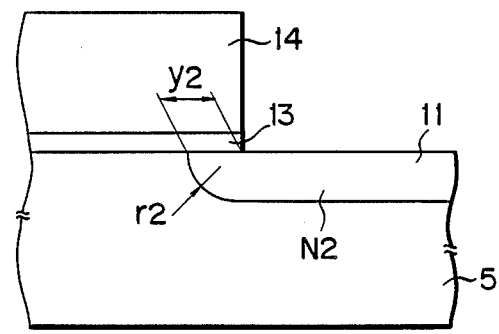
F I G. 8B

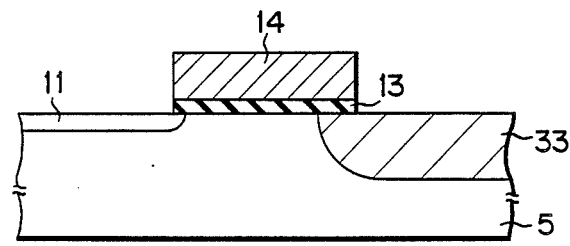
F I G. 10
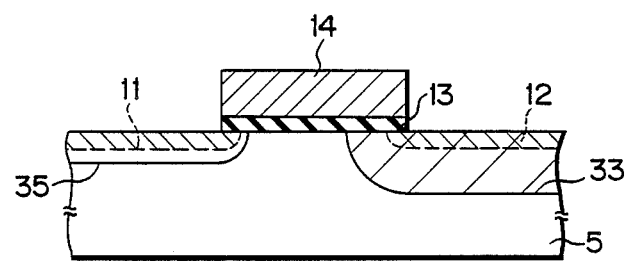
F I G. 11

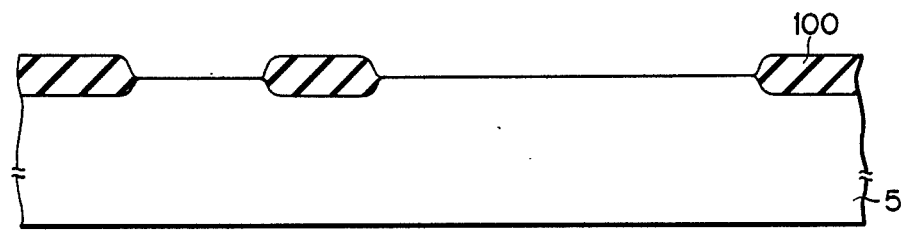
F I G. 13 A
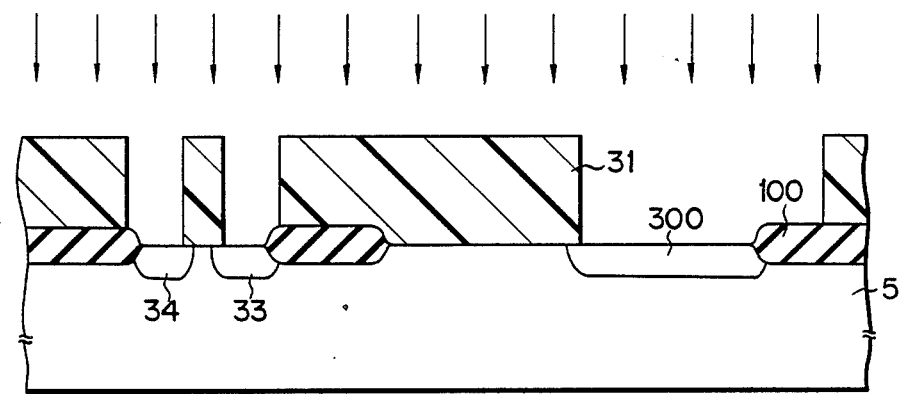
F I G. 13 B
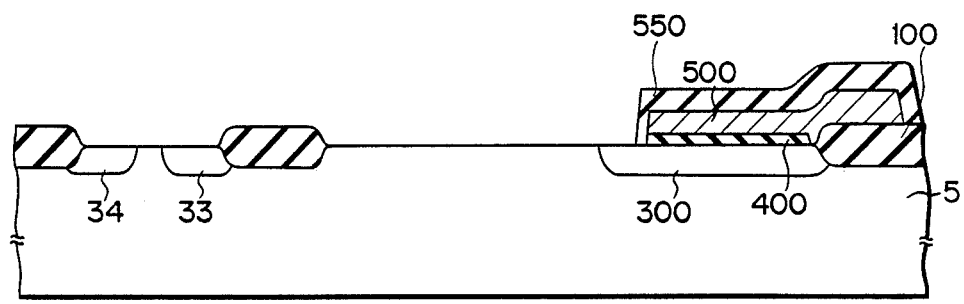
F I G. 13 C

METHOD OF MANUFACTURING SEMICONDUCTOR DEVICE

This application is a continuation of application Ser. No. 117,523 filed Nov. 6, 1987 now abandoned.

BACKGROUND OF THE INVENTION

The present invention relates to a method of manufacturing a semiconductor device, to form a MOS transistor by self-alignment.

In a semiconductor integrated circuit, a special circuit is provided for preventing the inner elements from breaking down as a result of an externally applied surge (pulse-like stress) or a DC stress (static high-voltage stress). This special circuit will hereinafter be referred to as an input protecting circuit.

FIG. 1 shows an example of the structure of a semiconductor integrated circuit wherein an electrical signal passes through lead 1, Au wire 2 electrically connected to lead 1, and Al pattern 3 electrically connected to wire 2 and formed on semiconductor substrate 5, and reaches inner circuit 41 via input protecting circuit 4

In FIG. 1, reference numeral 6 denotes a semi-conductor integrated circuit; and 7, molded resin.

FIG. 2 shows inner circuit 4 in FIG. 1. Circuit 4 comprises resistors R1 and R2 and MOS transistors Tr1 and Tr2. A surge entering to pattern 3 is attenuated by resistors R1 and R2 and is absorbed by MOS transistors Tr1 and Tr2. In addition, a static DC stress is absorbed by MOS transistor Tr2.

FIGS. 3 and 4 are sectional views of conventional MOS transistors Tr1 and Tr2. In FIG. 3, source region 11 and drain region 12 are formed in substrate 5, as are also gate insulating film 13 and gate electrode 14. FIG. 4 shows a MOS transistor in which shallow regions 17 and 18 having an impurity concentration lower than that of source region 15 and drain region 16 are formed between regions 15 and 16 and electrode 14. The MOS transistor shown in FIG. 4 is known as an LDD (lightly doped drain) transistor and has a structure which is advantageous as regards the micropatterning thereof.

The manufacturing steps of MOS transistors Tr1 and Tr2 are shown in FIGS. 5A and 5B. According to the manufacturing steps shown in these Figs, the source and drain regions of a MOS transistor of an input protecting circuit are formed by self-alignment, together with those of a MOS transistor of an inner circuit. That is, a thermal oxide film 13 and polysilicon 14 are formed on the surface of substrate 5 and then patterned, thereby forming gate oxide film 13 and gate electrode 14. Next, impurity 21 of a conductivity type different from that of substrate 5 is ion-implanted in the prospective source and drain region formation areas (FIG. 5A). Thereafter, source region 11 and drain region 12 are formed by thermal diffusion (FIG. 5B).

In order to perform micropatterning of a semiconductor element, depth xj of source and drain regions of a MOS transistor is generally shallow and the impurity concentration of them is generally high (FIG. 6).

However, when the impurity concentration of the source and drain regions of the MOS transistor is reduced, the resistance of the drain region is increased, as a result of which a junction breakdown current caused by a drain current is reduced.

In addition, when depth xj of the source and drain regions is designed to be shallow in depth, radius of curvature R of a junction side surface is reduced, which leads to an increase in the electric field in the depletion layer at the junction side surface, thereby degrading the junction breakdown withstand voltage.

However, if a MOS transistor of an input protecting circuit and that of an inner circuit are formed on a single semiconductor substrate, and both are formed by self-alignment, the following problem arises:

When the impurity concentration and the depth of the source and drain regions of a MOS transistor are reduced so as to achieve a high packing density of the elements, and a MOS transistor of an inner circuit, together with that of an input protecting circuit, is formed by self-alignment, this results in the degradation of the junction breakdown withstand characteristics of the MOS transistor for the input protecting circuit, and of the resistance to an external surge or DC stress outside the semiconductor integrated circuit.

SUMMARY OF THE INVENTION

Accordingly, it is an object of the present invention to provide a method of manufacturing a semiconductor device whereby the junction breakdown withstand characteristics of a MOS transistor of an input protecting circuit are improved over the conventional device.

The present invention is characterized in that an impurity of a conductivity type opposite to that of a semiconductor substrate is doped, through a mask, in the prospective source and drain region formation areas of a MOS transistor of an input protecting circuit, the source and drain regions are formed by mask alignment, an insulating film and a conductive film are sequentially formed after the mask member is removed, the desired patterns are etched on the insulating and conductive films, to form a gate insulating film and a gate electrode of a MOS transistor of an inner circuit and those of the MOS transistor of the input protecting circuit, an impurity of a conductivity type opposite to that of the semiconductor substrate is doped in at least the prospective source and drain region formation areas of the MOS transistor of the inner circuit, using the gate insulating film and the gate electrode as masks, thereby forming, by self-alignment, at least the source and drain regions of the MOS transistor of the inner circuit.

According to the present invention, the source and drain regions of the MOS transistor of the input protecting circuit are formed by mask alignment, the impurity concentration of the source or drain region is increased to reduce the diffusion resistance, thereby increasing the junction breakdown power generated by a drain current. In addition, by increasing the radius of curvature of the junction curved surface portion of the source and drain regions of the MOS transistor of the input protecting circuit, the electric field of the junction curved surface portion is reduced, thereby improving the junction breakdown withstand characteristics.

When the impurity concentration of the source and drain regions of the MOS transistor is increased, the junction breakdown power caused by the drain current is increased. This happens because the junction breakdown power of an LDD transistor having a structure in which the diffusion layer resistances of the source and drain regions of the MOS transistor are high is lower than that of the MOS transistor with a low diffusion layer resistance.

The reason for this is as follows:

Assume that the diffusion layer resistance is R. Power W caused by drain current I of the MOS transistor is obtained as follows:

$$W = I^2 R$$

That is, the higher resistance R is, the smaller current I, which causes power W, becomes.

In addition, it is apparent from an electromagnetic law that when the radius of curvature at the junction curved surface portion of the source or drain region of a MOS transistor and the like is increased, the electric field of a curved surface region is reduced.

When the electric field of the curved surface region is reduced, the junction breakdown current is dissipated. As a result, permanent breakdown rarely occurs at the junction curved surface portion.

In order to achieve the effect of the present invention to the maximum, both the source and drain regions of the MOS transistor are formed to have a low resistance, and -the radii of curvature at the junction curved surface portions of the source and drain regions of the MOS transistor are increased.

However, the effect of the present invention can also be achieved either by forming the source and drain regions of the MOS transistor to have a low resistance or by increasing the radii of curvature at the junction curved surface portions thereof.

The present invention is characterized in that source and drain regions of a MOS transistor of an input protecting circuit of a semiconductor integrated circuit having an input protecting circuit and an inner circuit on a single semiconductor substrate are formed by doping an impurity in the prospective source and drain region formation areas by mask alignment. In a semiconductor integrated circuit having a CMOS structure, the source and drain regions of the MOS transistor can be formed simultaneously with the formation of well regions during the photolithographic step for forming an n-type well region and a p-type well region of the MOS transistor, thereby reducing the number of manufacturing steps. When the source and drain regions of the MOS transistor are formed simultaneously with the formation of the well regions of the CMOS transistor, the radii of curvature at the junction curved surface portions of the source and drain regions of the MOS transistor can be increased.

In addition, in a dynamic memory in which each memory cell is constituted by a MOS transistor and a MOS capacitor, an impurity is implanted to deplete the MOS capacitor before the gate electrode of the MOS transistor is formed by patterning. According to the present invention, the source and drain regions of the MOS transistor can be formed by implanting the impurity for depleting the source and drain regions of the MOS transistor during the photolithographic step for implanting the impurity to deplete the MOS capacitor, thereby reducing the number of manufacturing steps. When the source and drain regions of the MOS transistor are formed by the impurity implanted to deplete the MOS capacitor, the diffusion layers of the source and drain regions can be formed so as to have a low resistance.

Note that if a MOS transistor has an LDD structure, the impurity concentration of the source and drain regions will be lower than that of a depletion region. In addition, as a semiconductor integrated circuit is highly integrated, the diffusion resistance of the source and drain regions of the MOS transistor tends to be higher than a specific resistance of the depletion region.

BRIEF DESCRIPTION OF THE DRAWINGS

FIGS. 7A to 7D are sectional views showing the steps of a method of manufacturing a semiconductor device according to the present invention, in which FIG. 7A is a sectional view in which a field oxide film is formed on a semiconductor substrate and is then patterned to expose surface regions of the semiconductor substrate which correspond respectively to the formation area of a MOS transistor an input protecting circuit and that of an inner circuit, FIG. 7B is a sectional view in which a photoresist film is coated over the entire top surface of the semiconductor substrate and that of the field oxide film, and is then patterned to expose semiconductor substrate surface regions which correspond respectively to a prospective source region formation area and a prospective drain region formation area of the MOS transistor of the input protecting circuit, and an impurity of a conductivity type opposite to that of the semiconductor substrate is ion-implanted therein, FIG. 7C is a sectional view in which the source and drain regions of the MOS transistor of the input protecting circuit are formed, and an insulating film and a conductive film are formed over the entire top surface of the semiconductor substrate and that of the field oxide film, and are then patterned to form the gate insulating film and the gate electrode of the MOS transistor of the input protecting circuit and of that of the inner circuit, and FIG. 7D is a sectional view in which an impurity of a conductivity type opposite to that of the semiconductor substrate is ion-implanted to form the source and drain regions of the MOS transistor of the inner circuit, and an impurity is also ion-implanted in the source and drain regions of the MOS transistor of the input protecting circuit;

FIG. 8A is a sectional view of part of the MOS transistor of the input protecting circuit manufactured by way of the steps shown in FIGS. 7A to 7D;

FIG. 8B is a sectional view of part of the MOS transistor of the inner circuit manufactured by way of the steps shown in FIGS. 7A to 7D;

FIGS. 9A to 9C are sectional views of manufacturing steps showing another embodiment of the present invention, in which FIG. 9A is a sectional view in which a field oxide film is formed on a semiconductor substrate and is then patterned to expose surface regions of the semiconductor substrate which correspond to a MOS transistor formation area of an input protecting circuit and that of an inner circuit, FIG. 9B is a sectional view in which a photoresist film is coated over the entire top surface of the semiconductor substrate and that of the field oxide film, and is then patterned to expose the semiconductor substrate surface regions which respectively correspond to a prospective source region formation area and a prospective drain region formation area of the MOS transistor of the input protecting circuit, and an impurity of a conductivity type opposite to that of the semiconductor substrate is ion-planted therein, and FIG. 9C is a sectional view in which a photoresist film formed in the step shown in FIG. 9B or after removing the photoresist film, another photoresist film is coated and patterned, and then an impurity of a conductivity type opposite to that of the semiconductor substrate or impurity ion having the same conductivity type as that implanted in the step shown in FIG. 9B is implanted in the source and drain regions of the input protecting circuit formed in the step shown in FIG. 9B;

FIG. 10 is a sectional view in which one of the source and drain regions of a MOS transistor of an input protecting circuit is formed by mask alignment, using a photoresist film;

FIG. 11 is a sectional view in which an ion is implanted in the source region of a MOS transistor, and an ion different from the ion implanted in the source region is implanted in the drain region, by means of mask alignment, so as to form source and drain regions having different depth;

FIGS. 12A to 12F are sectional views showing steps in manufacturing a semiconductor device according to still another embodiment of the present invention, in which FIG. 12A is a sectional view in which a photoresist film i patterned after the photoresist film is coated on a p-type substrate, photoresist film portions corresponding to perspective source and drain region formation areas of a MOS transistor in an input protecting circuit and a prospective well region formation area of a CMOS transistor in an inner circuit are etched, and n-type impurity ions are implanted, FIG. 12B is a sectional view in which the ionimplanted impurity in FIG. 12A is thermally diffused to form source and drain regions of the MOS transistor of the input protecting circuit and an n-type well region of the CMOS transistor of the inner circuit, and a field oxide film is formed to define active region on prospective surface, FIG. 12C is a sectional view in which gate oxide films and gate electrodes of the MOS transistor of the input protecting circuit and the CMOS transistor of the inner circuit, FIG. 12D is a sectional view in which a photoresist film is coated on the entire surface and patterned to expose prospective source and drain region formation areas of a p-channel MOS transistor in the CMOS transistor in the inner circuit, and p-type impurity ions are implanted in these areas to form the source and drain regions, FIG. 12E is a sectional view in which a photoresist film is coated and patterned to expose source and drain regions of the MOS transistor of the input protecting circuit and prospective source and drain region formation areas of an n-channel MOS transistor of the CMOS transistor of the inner circuit, and the N type impurity ions are implanted in these regions and these areas, and FIG. 12F is a sectional view in which the photoresist film formed in FIG. 12E is removed.

FIGS. 13A to 13E are sectional views for explaining steps in manufacturing a semiconductor device according to still another embodiment of the present invention, in which FIG. 13A is a sectional. view in which a field oxide film is formed on an n-type substrate, FIG. 13B is a sectional view in which a photoresist film is formed to cover the entire surface and is patterned to expose prospective source and drain region formation areas of a MOS transistor of an input protecting circuit and a prospective depletion region formation area of a dynamic memory in an inner circuit, and n-type impurity ions are implanted in these areas to form source and drain regions of the MOS transistor of the input protecting circuit, and the depletion region of the dynamic memory of the inner circuit, FIG. 13C is a sectional view in which the substrate is oxidized, a capacitor insulating film of the dynamic memory is formed on a part of the depletion region, and then a plate electrode is formed on the prospective surface including capacitor insulating film, and then an interlayer insulating film is selectively formed and fully cover the plate electrode of the dynamic memory, FIG. 13D is a sectional view in which a MOS transistor of the input protecting circuit, a gate insulating film of the dynamic memory, and a gate electrode thereof are formed, and n-type impurity ions are implanted in the source and drain regions of the MOS transistor of the input protecting circuit and the prospective source and drain region formation areas of the dynamic memory of the inner circuit, and FIG. 13E is a sectional view in which an insulating film is formed to cover the entire surface and contact holes are opened in the insulating film.

DETAILED DESCRIPTION OF THE PREFERRED EMBODIMENTS

Embodiments of a method of manufacturing a semiconductor device according to the present invention will now be described below, with reference to the accompanying drawings.

Figure 1:
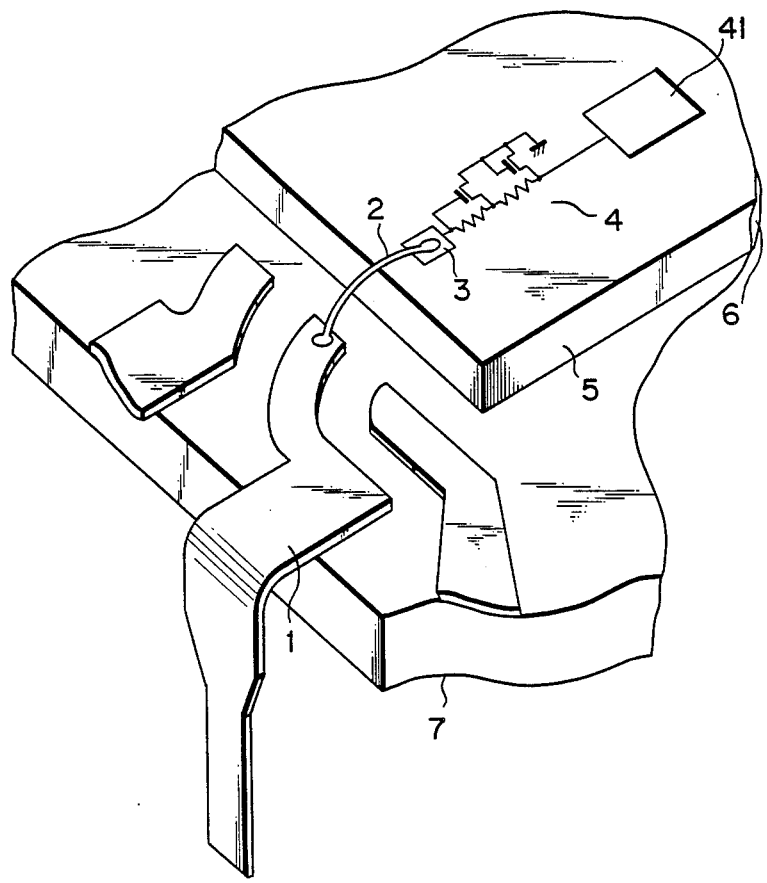
FIG. 1 is a perspective view of part of a semiconductor integrated circuit.
Figure 2:
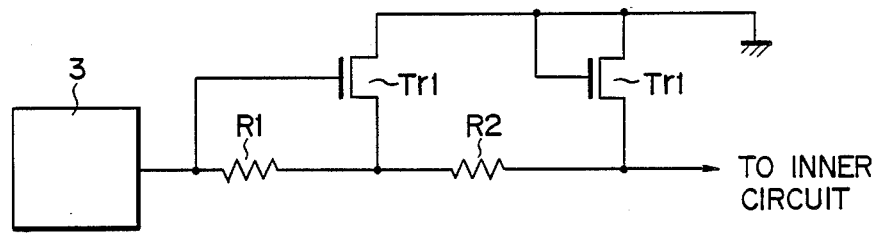
FIG. 2 is a circuit diagram of an input protecting circuit.
Figure 3:
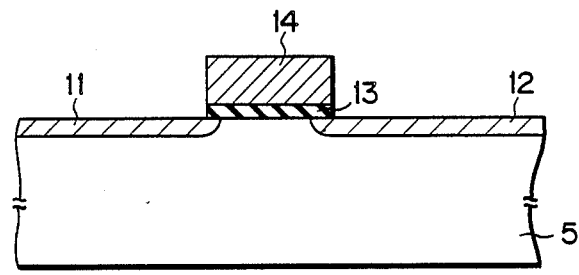
FIGS. 3 and 4 are sectional views of MOS transistors.
Figure 4:
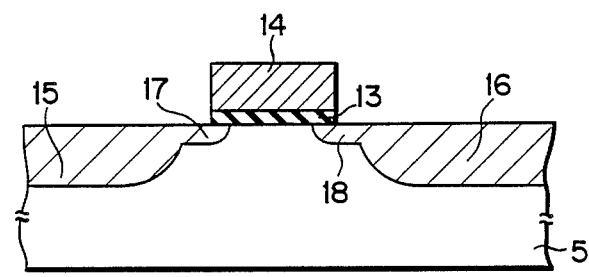
Figure 5A:
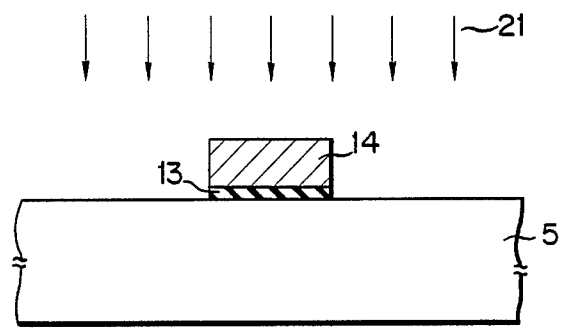
FIGS. 5A and 5B are sectional views showing manufacturing steps of the MOS transistor shown in FIG. 3.
Figure 5B:
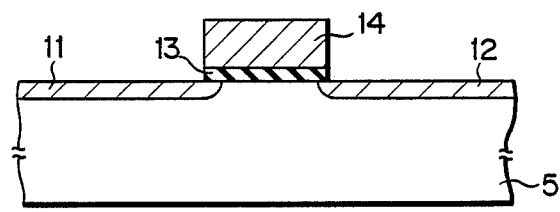
Figure 6:
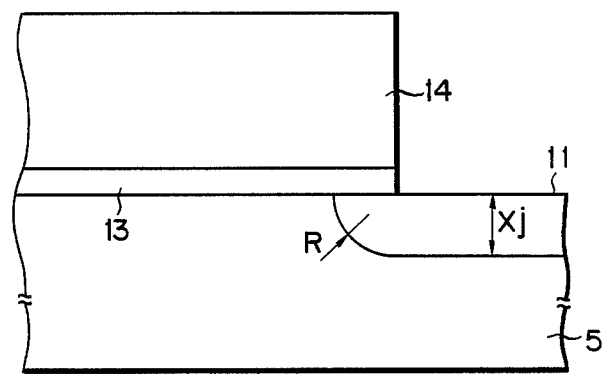
FIG. 6 is an enlarged sectional view of part of the MOS transistor manufactured by the steps shown in FIGS. 5A and 5B.
Figure 7A:
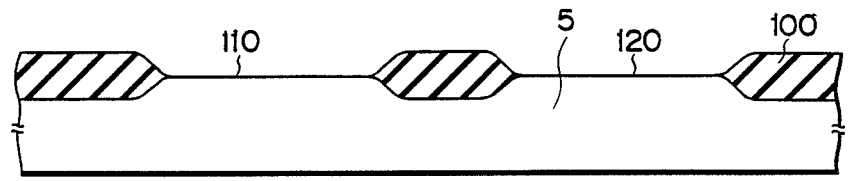

Firstly, p-type semiconductor substrate 5 is selectively oxidized in an $H_2O$ atmosphere at a temperature of 1,000° C., to selectively form 1-$\mu$m thick field oxide film 100. Thereafter, element region 110 of an input protecting circuit and element region 120 of an inner circuit are formed (FIG. 7A).

Next, photoresist film 31 is coated over the entire top surface of the substrate 5 and is then patterned to expose only those portions of substrate 5 which correspond respectively to the prospective source and drain region formation areas of the MOS transistor of the input protecting circuit. Then, using patterned film 31 as a mask, n-type ions 32- for instance, phosphorus (P) ions- are ion-implanted, at 100 keV, in the prospective source and drain region formation areas. As a result, source region 33 and drain region 34 of the MOS transistor of the input protecting circuit are formed (FIG. 7B).

After film 31 is removed, 200-Å thick silicon oxide film 13 is formed over the entire top surface of a wafer in an HCl gas atmosphere at a temperature of 900° C. Subsequently, a conductive polysilicon film doped with a p-type impurity having a concentration of about $10^{19}$ to $10^{21}$ cm$^{-3}$ is formed thereon by use of the LPCVD method. Film 13 and the conductive polysilicon film are patterned so as to form gate electrode 20 of the MOS transistor of the input protecting circuit and gate electrode 21 of the MOS transistor of the inner circuit. As a result, the prospective source and drain region formation areas of the MOS transistor of the inner circuit are formed (FIG. 7C).

Then, As ions 35 are implanted in the source and drain regions of the MOS transistor of the input protecting circuit and in those of the MOS transistor of the inner circuit, using as masks electrode 20 of the MOS transistor of the input protecting circuit and electrode 21 of the MOS transistor of the inner circuit. As a result, source region 11 and drain region 12 of the MOS transistor of the inner circuit are formed (FIG. 7D).

Figure 7B:
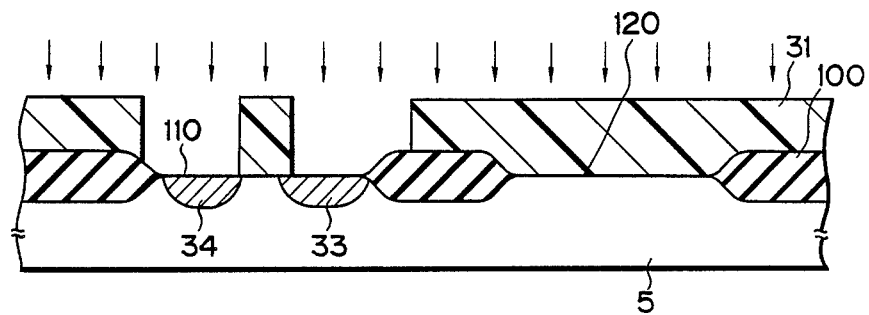
Figure 7C:
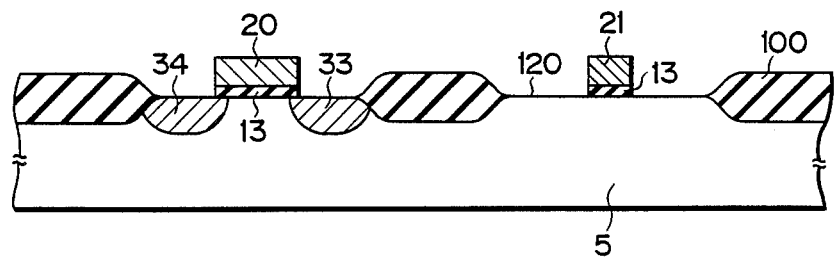
Figure 7D:
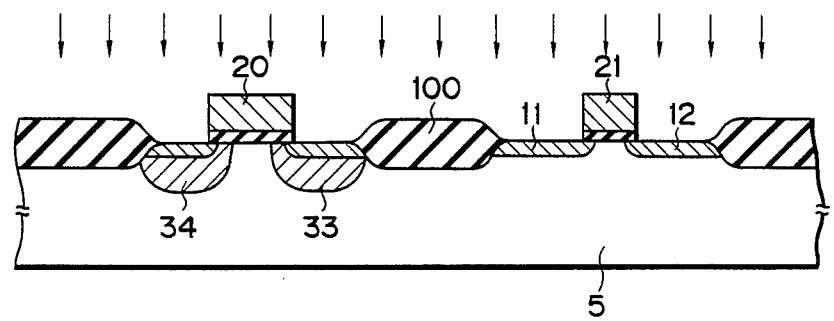

In addition, As 32 ions are implanted in regions 33 and 34 of the MOS transistor of the input protecting circuit formed in the step shown in FIG. 7B. That is, As ions 35 are implanted in regions 33 and 34 of the MOS transistor of the input protecting circuit, in addition to the phosphorus (P) ions which are implanted therein in the step shown in FIG. 7B. Therefore, regions 33 and 34 of the MOS transistor of the input protecting circuit contain conductive impurities at a high concentration. In addition, since regions 33 and 34 of the MOS transistor of the input protecting circuit are formed by implanting phosphorus (P) ions therein, both regions are therefore deep.

FIGS. 8A and 8B respectively show partial sections of the MOS transistor of the input protecting circuit and that of the inner circuit formed in the steps shown in FIGS. 7A to 7D. Assume that the impurity concentration of the source or drain region of the MOS transistor of the input protecting circuit is N1, the curvature of the junction side surface thereof is r1, and the width in a transverse direction thereof is y1, and that the impurity concentration of the source or drain region of the MOS transistor of the inner circuit is N2, the curvature of the junction side surface thereof is r2, and the width in a transverse direction thereof is y2.

In order to obtain the effect of the present invention, assume that relationships between the above factors satisfy the following conditions:

$y1 > y2$, $r1 > r2$, $N1 > N2$

Figure 9A:
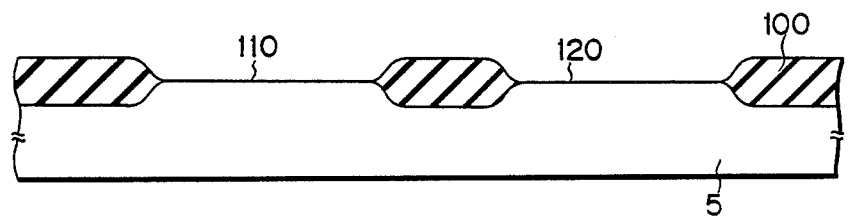
Figure 9B:
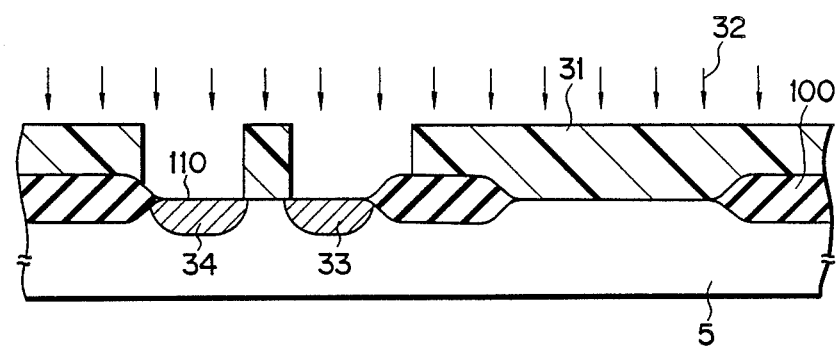
Figure 9C:
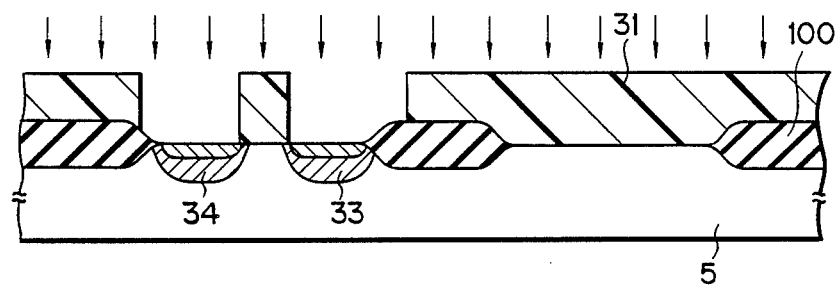

FIGS. 9A to 9C are sectional views of manufacturing steps showing another embodiment of a method of manufacturing a semiconductor device according to the present invention. This embodiment of the present invention will now be described below.

Firstly, p-type semiconductor substrate 5 is oxidized in an $H_2O$ atmosphere at a temperature of 1,000° C., to selectively form 1-μm thick field oxide film 100. Thereafter, element region 110 of an input protecting circuit and element region 120 of an inner circuit are formed therein (FIG. 9A).

Next, photoresist film 31 is coated over the entire top surface of film 100 and is then patterned to expose those portions of substrate 5 which correspond respectively to the prospective source and drain region formation areas of the MOS transistor of region 110 of the input protecting circuit. Then, using patterned film 31 as a mask, n-type ions 32- for instance, phosphorus (P) ions-are implanted, at 100 keV, in the prospective source and drain region formation areas. As a result, source region 33 and drain region 34 of the MOS transistor of the input protecting circuit are formed (FIG. 9B).

Thereafter, using film 31 as a mask, or using another film as a mask, which is obtained by coating an additional photoresist film after removing film 31 and patterning it, phosphorus (P) ions or ions having the same conductivity type as described above are implanted in regions 33 and 34 (FIG. 9C).

Thus, regions 33 and 34 of the MOS transistor of the input protecting circuit are formed by implanting, in a mask-aligned manner, the same ions or ions having the same conductivity type as in the previous step.

Thereafter, the MOS transistor of the input protecting circuit and that of the inner circuit are formed in the same manufacturing steps as those shown in FIGS. 7C to 7D.

Note that the number of ion implantation cycles performed when the source and drain regions of the MOS transistor of the input protecting circuit are formed by mask alignment is not limited to two, but may be a plurality of times more than two.

FIG. 10 shows a third embodiment of the present invention. In the third embodiment, only one of the source and drain regions of a MOS transistor of an input protecting circuit- for example, source region 33- is formed by mask alignment, using photoresist film 31 as a mask.

FIG. 11 shows a fourth embodiment of the present invention. In the fourth embodiment, the source and drain regions of a MOS transistor of an input protecting circuit are both formed by mask alignment of a photoresist film. However, the type of ions implanted in the source region of the MOS transistor differs from that implanted in the drain region thereof. Therefore, since different types of ions are respectively implanted in the source and drain regions of the MOS transistor, the source and drain regions are structurally unbalanced.

The present invention is not limited to the above embodiments. For example, in the above embodiments, the source and drain regions of the MOS transistor of the input protecting circuit are formed by mask alignment, the gate electrodes of the MOS transistor of the input protecting circuit and that of the inner circuit are then formed, and ions are implanted in the source and drain regions of the MOS transistor of the input protecting circuit and the prospective source and drain region formation areas of the MOS transistor of the inner circuit, using the gate electrodes as masks. On the other hand, the source and drain regions of the MOS transistor of the input protecting circuit may be coated with a photoresist film, so as to prevent ion implantation.

In addition, the source and drain regions of the MOS transistor of the input protecting circuit can be formed not by ion implantation but, for example, by diffusion of an impurity. When the source and drain regions of the MOS transistor of the input protecting circuit are formed by impurity diffusion, a silicon nitride film may be used as a mask against impurity diffusion, and phosphorus ions may be thermally diffused from phosphorus glass containing an impurity of high concentration.

A fourth embodiment will be described with reference to FIGS. 12A to 12F.

Figure 12A:
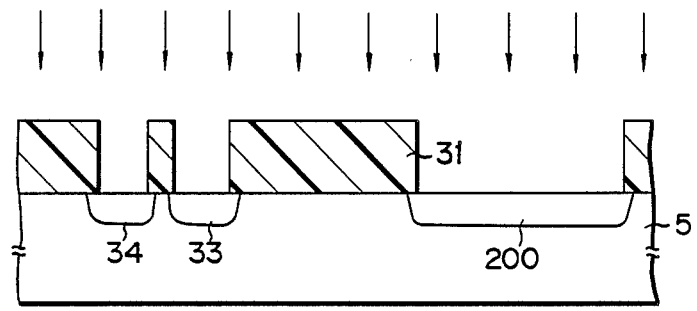

An inner circuit in this embodiment is formed by a CMOS transistor. Photoresist film 31 is coated on p-type semiconductor substrate 5 and is patterned to expose prospective source and drain region formation areas of a MOS transistor of an input protecting circuit and a prospective well region formation area of a CMOS transistor of an inner circuit. Phosphorus (P) ions are implanted in these areas using photoresist film 31 as a mask at an acceleration voltage of 130 keV and a dose of $1 \times 10^{13}$ cm$^{-2}$. The ion-implanted phosphorus ions are thermally diffused in $N_2$ gas atmosphere at 1,000° C. for 2 hours to form source and drain regions 33 and 34 of the MOS transistor of the input protecting circuit and n-type well region 200 of the CMOS transistor of the inner circuit (FIG. 12A).

Figure 12B:
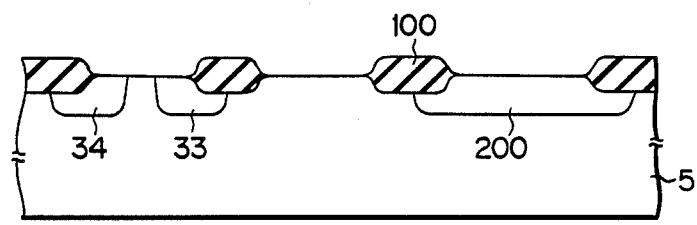

The entire surface of substrate 5 is selectively oxidized in $H_2O$ atmosphere at 1,000° C. to form 1-μm thick field oxide film 100 (FIG. 12B).

Figure 12C:
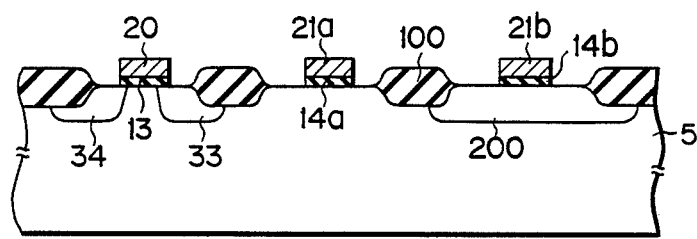

A 200-Å thick silicon oxide film as a gate oxide of MOS transistor is partially formed on the surface of the P type substrate 5 in HCl gas at 900° C. A 4,000-Å thick conductive polysilicon film doped with a n-type impurity of $10^{19}$ to $10^{21}$ cm$^{31}$ $^3$, is formed by LPCVD. The silicon oxide and conductive polysilicon films are patterned to form gate oxide film 13 and gate electrode 20 of the MOS transistor of the input protecting circuit and gate oxide films 14a and 14b and gate electrodes 21a and 21b of the CMOS transistor of the inner circuit (FIG. 12C).

Figure 12D:
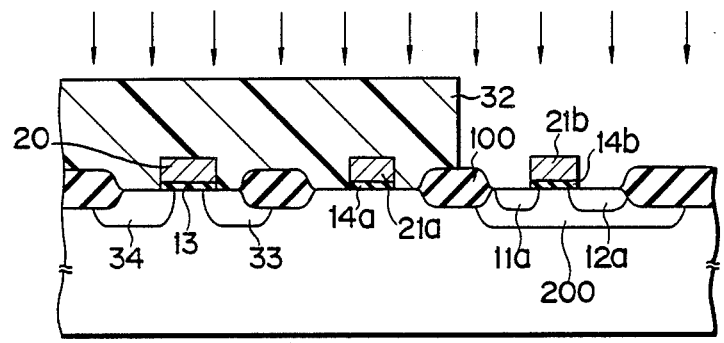

Photoresist film 32 having an opening corresponding to n-type well region 200 of the CMOS transistor is used as a mask to form a p-channel MOS transistor of the CMOS transistor of the inner circuit, and boron ions are implanted through the opening at an acceleration voltage of 100 keV, thereby forming source and drain regions 11a and 12a of the p-channel MOS transistor (FIG. 12D).

After photoresist film 32 is eliminated, photoresist film 33 masking only the p-channel MOS transistor of the CMOS transistor of the inner circuit is patterned, and arsenic (As) ions are implanted in source and drain regions 33 and 34 of the MOS transistor of the input protecting circuit and the prospective source and drain region formation areas of the n-channel MOS transistor of the inner circuit at an acceleration voltage of 60 keV.

Figure 12E:
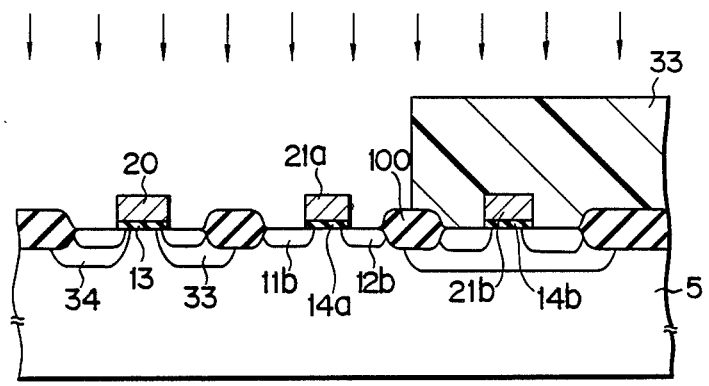
Figure 12F:
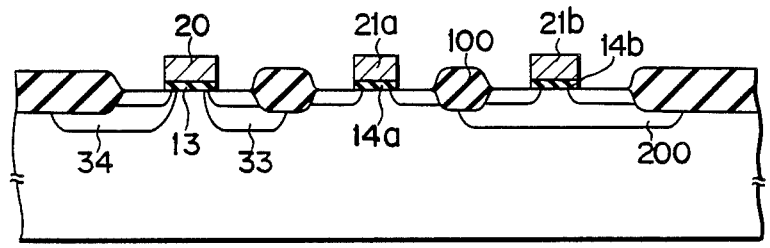

As a result, source and drain regions 11b and 12b of the n-channel MOS transistor of the inner circuit are formed (FIG. 12E).

Phosphorus may be ion-implanted in place of arsenic.

Since arsenic ions are implanted in addition to phosphorus (P) ions implanted in source and drain regions 33 and 34 of the MOS transistor of the input protecting circuit in the process shown in FIG. 12B, the surface concentration of source and drain regions 33 and 34 of the MOS transistor of the input protecting circuit becomes high. In addition, since phosphorus (P) ions are implanted in source and drain regions 33 and 34 of the MOS transistor of the input protecting circuit, source and drain regions 33 and 34 become deep.

Finally, photoresist film 33 is eliminated to form the MOS transistor of the input protecting circuit and the CMOS transistor of the inner circuit by carrying out thermal annealing.

Figure 13D:
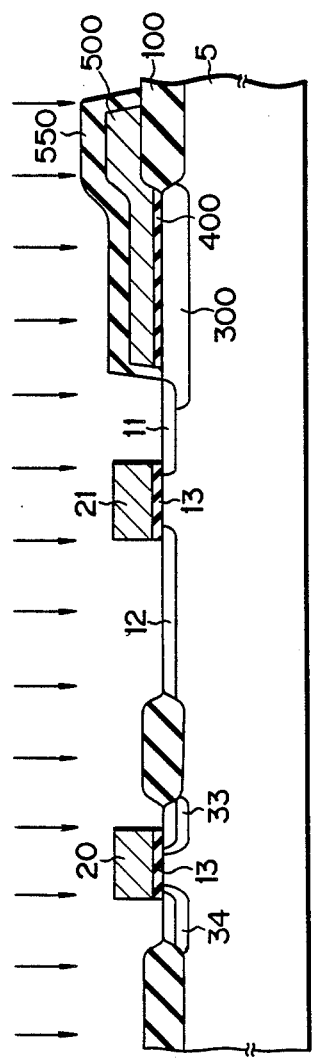

A fifth embodiment of the present invention will be described with reference to FIGS. 13A to 13E. This embodiment exemplifies a dynamic memory cell structure as the inner circuit. N-type substrate 5 is selectively oxidized in H$_2$O atmosphere at 1,000° C. to form 1-μm thick field oxide film 100. As a result, prospective input protecting and inner circuit formation areas are defined on substrate 5 (FIG. 13A).

Photoresist film 31 is coated on the entire surface of substrate 5 including field oxide film 100. Photoresist film 31 is patterned to expose prospective source and drain region formation areas of a MOS transistor of the input protecting circuit and a prospective depletion region formation area of a dynamic memory cell of the inner circuit. Phosphorus (P) ions or Arsenic (As) ions are implanted in the prospective source and drain region formation areas and the prospective depletion region formation area by using photoresist film 31 as a mask at an acceleration voltage of 80 keV and a dose of $1 \times 10^{14}$ cm$^{-2}$.2 As a result, source and drain regions 33 and 34 of the MOS transistor of the input protecting circuit and depletion region 300 of the dynamic memory cells of the inner circuit are formed by thermal annealing after photoresist 31 is removed (FIG. 13B).

The surface of substrate 5 is thermally oxidized to form a 100-Å thick oxide film thereon, and a polysilicon layer is formed thereon by CVD method and phosphorus (P) is diffused from Pocl 3 gas doping system. The oxide film and the polysilicon layer are patterned and are left on a part of depletion region 300 of the dynamic memory cell. In a result, capacitor insulating film 400 and plate electrode 500 are formed. After that an interlayer insulating film 550 is selectively formed and fully covers the plate electrode (FIG. 13C).

Substrate 5 is oxidized in HCl atmosphere at 900° C. to form a 200-Å thick oxide film. In addition, a polysilicon layer having a thickness of 4,000-Å is deposited by CVD to cover the entire surface. The oxide film and the polysilicon layer are sequentially patterned to form gate insulating film 13 and gate electrode 20 of te MOS transistor of the input protecting circuit and gate insulating film 13 and gate electrode 21 of the inner circuit. Arsenic (As) ions are then implanted in the entire surface at an acceleration voltage of 60 keV to form source and drain regions 11 and 12 of the dynamic memory cell.

Figure 13E:
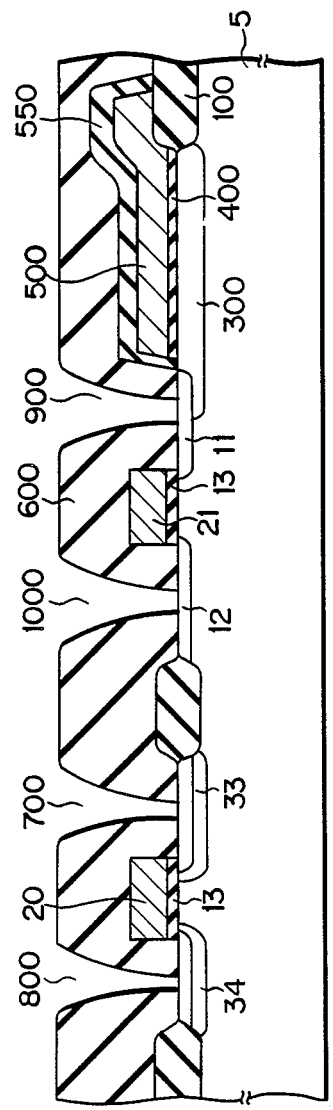

Oxide film 600 is formed by CVD to cover the entire surface. Contact holes 700 and 800 are formed for source and drain regions 33 and 34 of the MOS transistor of the input protecting circuit and contact holes 900 and 1000 are formed for source and drain regions 11 and 12 of the dynamic memory cell of the inner circuit (FIG. 13E).

What is claimed is:

1. A method of manufacturing a semiconductor device, including the steps of:
    selectively forming a field oxide film on a semiconductor substrate of a first conductivity type;
    forming a mask member over the entire top surface of said semiconductor substrate and that of said field oxide film, and patterning said mask member, to expose a prospective source region formation area and a prospective drain region formation area of a MOS transistor of an element region of an input protecting circuit;
    doping an impurity of a second conductivity type in said prospective source region formation area and said prospective drain region formation area of said MOS transistor of said input protecting circuit by mask alignment, using said mask member on the element region of said input protecting circuit as a mask, to form a source region and a drain region of said MOS transistor of said input protecting circuit;
    removing said mask member;
    sequentially forming an insulating film and a polycrystalline layer doped with the impurity of the second conductivity type over the entire top surface of said semiconductor substrate and that of said field oxide film;
    patterning said insulating film and said polycrystalline layer, to form gate electrodes of said MOS transistor of said input protecting circuit and of a MOS transistor of an inner circuit; and
    implanting ions of the second conductivity type in said source and drain regions of said MOS transistor of said input protecting circuit and a prospective source region formation area and in a prospective drain region formation area of said inner circuit by self-alignment, using said gate electrodes as masks.

2. A method according to claim 1, wherein the step of forming said mask member over the entire top surface of said semiconductor substrate and that of said field oxide film and patterning said mask member is the step of forming a photoresist film as said mask member over the entire top surface of said semiconductor substrate and that of said field oxide film and patterning said photoresist film.

3. A method according to claim 1, wherein the step of forming said mask member over the entire top surface of said semiconductor substrate and that of said field oxide film and patterning said mask member is the step of forming a silicon nitride film over the entire top surface of said semiconductor substrate and that of said field oxide film and patterning said silicon nitride film.

4. A method according to claim 1, wherein the step of doping the impurity of the second conductivity type, using said mask member as a mask, is the step of implanting ions of an impurity of the second conductivity type.

5. A method according to claim 1, wherein the step of doping the impurity of the second conductivity type, using said mask member as a mask, is the step of thermally diffusing an impurity of the second conductivity type.

6. A method according to claim 4, wherein the step of implanting the ions of the second impurity, using said mask member as a mask, is the step of performing ion implantation at least twice.

7. A method of manufacturing a semiconductor device, including the steps of:
selectively forming a field oxide film on a semiconductor substrate of a first conductivity type;
selectively removing said field oxide film to form an element region of an input protecting circuit and an element region of an inner circuit;
forming a first mask member over the entire top surface of said semiconductor substrate and that of said field oxide film, and patterning said mask member, to expose one of a prospective source region formation area and a prospective drain region formation area of a MOS transistor of the element region of said input protecting circuit;
doping an impurity of a second conductivity type in an exposed one of the prospective source and drain region formation areas of said MOS transistor of said input protecting circuit by mask alignment, using said first mask member as a mask on the element region of said input protecting circuit, to form source and drain regions of said MOS transistor of said input protecting circuit;
removing said first mask member;
forming a second mask member over the entire top surface of said semiconductor substrate and that of said field oxide film, and patterning said second mask member, to expose one of said prospective source and drain region formation areas of said MOS transistor of said input protecting circuit not doped with the impurity of the first conductivity type, said exposed one not being doped with the impurity of the second conductivity type;
doping an impurity of the second conductivity type and an impurity different from said impurity of the second conductivity type, using said second mask member as a mask;
removing said second mask member;
sequentially forming an insulating film and a polycrystalline layer doped with an impurity of the second conductivity type over the entire top surface of said semiconductor substrate and that of said field oxide film;

patterning said insulating film and said polycrystalline layer, to form gate electrodes of said MOS transistor of said input protecting circuit and of said MOS transistor of said inner circuit; and
implanting ions of the second conductivity type in said prospective source and drain region formation areas of said MOS transistor of said input protecting circuit by self-alignment, using said gate electrodes as masks.

8. A method according to claim 7, wherein the step of forming said first mask member over the entire top surface of said semiconductor substrate and that of said field oxide film and patterning said first mask member is the step of forming a photoresist film as said first mask member over the entire top surface of said semiconductor substrate and that of said field oxide film and patterning said photoresist film.

9. A method according to claim 7, wherein the step of forming said mask member over the entire top surface of said semiconductor substrate and that of said field oxide film and patterning said mask member is the step of forming a silicon nitride film as said first mask member over the entire top surface of said semiconductor substrate and that of said field oxide film and patterning said silicon nitride film.

10. A method according to claim 7, wherein the step of doping the impurity of the second conductivity type, using said first mask member as a mask, is the step of implanting ions of an impurity of the second conductivity type.

11. A method according to claim 7, wherein the step of doping the impurity of the second conductivity type, using said first mask member as a mask, is the step of thermally diffusing an impurity of the second conductivity type.

12. A method according to claim 7, wherein the step of forming said second mask member over the entire top surface of said semiconductor substrate and that of said field oxide film and patterning said second mask member is the step of forming a photoresist film as said second mask member over the entire top surface of said semiconductor substrate and that of said field oxide film and patterning said photoresist film.

13. A method according to claim 7, wherein the step of forming said second mask member over the entire top surface of said semiconductor substrate and that of said field oxide film and patterning said second mask member is the step of forming a silicon nitride film over the entire top surface of said semiconductor substrate and that of said field oxide film and patterning said silicon nitride film.

14. A method according to claim 7, wherein said step of doping said impurity of the second conductivity type and said impurity different from said impurity of the second conductivity type, using said second mask member as a mask, is the step of implanting ions of said impurity of the second conductivity type and said impurity different from said impurity of the second conductivity type.

15. A method according to claim 7, wherein said step of doping said impurity of the second conductivity type and said impurity different from said impurity of the second conductivity type, using said second mask member as a mask, is the step of thermally diffusing said impurity of the second conductivity type and said impurity different from said impurity of the second conductivity type.

* * * * *